United States Patent [19]

Gannon et al.

[11] Patent Number: 4,618,836

[45] Date of Patent: Oct. 21, 1986

[54] WIDE BAND DIELECTRIC RESONATOR OSCILLATOR HAVING TEMPERATURE COMPENSATION

[75] Inventors: Mark A. Gannon, Carpentersville; Francis R. Yester, Jr., Arlington Heights; Paul H. Gailus, Prospect Heights, all of Ill.

[73] Assignee: Motorola, Inc., Schaumburg, Ill.

[21] Appl. No.: 685,662

[22] Filed: Dec. 24, 1984

[51] Int. Cl.[4] .......................... H03B 5/18; H03B 7/14
[52] U.S. Cl. ............................... 331/96; 331/107 DP; 331/117 D; 331/176
[58] Field of Search ............... 331/96, 107 DP, 117 D, 331/176, 177 V; 333/234, 235

[56] References Cited

U.S. PATENT DOCUMENTS

| | | | |
|---|---|---|---|
| 3,623,146 | 11/1971 | Kaneko et al. | 331/176 X |
| 3,665,341 | 5/1972 | Sekine et al. | 331/96 X |
| 3,925,740 | 12/1975 | Steensma | 333/235 |
| 4,019,161 | 4/1977 | Kimura et al. | 333/235 X |
| 4,024,481 | 5/1977 | Kivi | 333/234 X |
| 4,136,320 | 1/1979 | Nishikawa et al. | 333/234 X |
| 4,459,570 | 7/1984 | Dalaballe et al. | 333/235 X |

*Primary Examiner*—Eugene R. LaRoche
*Assistant Examiner*—D. C. Mis
*Attorney, Agent, or Firm*—Donald B. Southard; Charles L. Warren; Edward M. Roney

[57] ABSTRACT

A improved microwave dielectric oscillator module which is provided with a removable temperature compensated dielectric resonator channel element is described. The removable temperature compensated dielectric resonator channel element cooperates with an electrically shielded housing. A substrate is mounted within the housing. Microstrip or stripline conductive patterns deposited on the substrate couple energy from the removable dielectric resonator to the remainder of the oscillator circuitry. The oscillator achieves wideband operation utilizing a GaAs FET transistor as the oscillators active element in conjunction with an intergral trombone-line phase adjuster.

5 Claims, 4 Drawing Figures

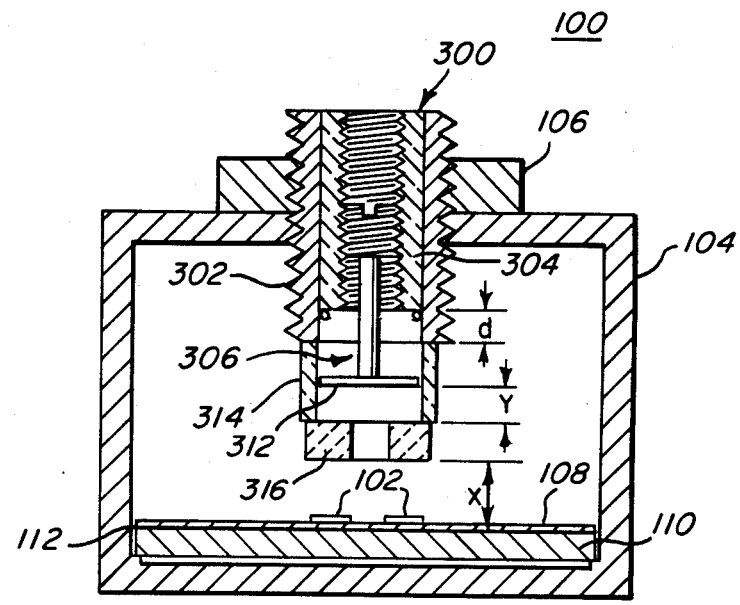
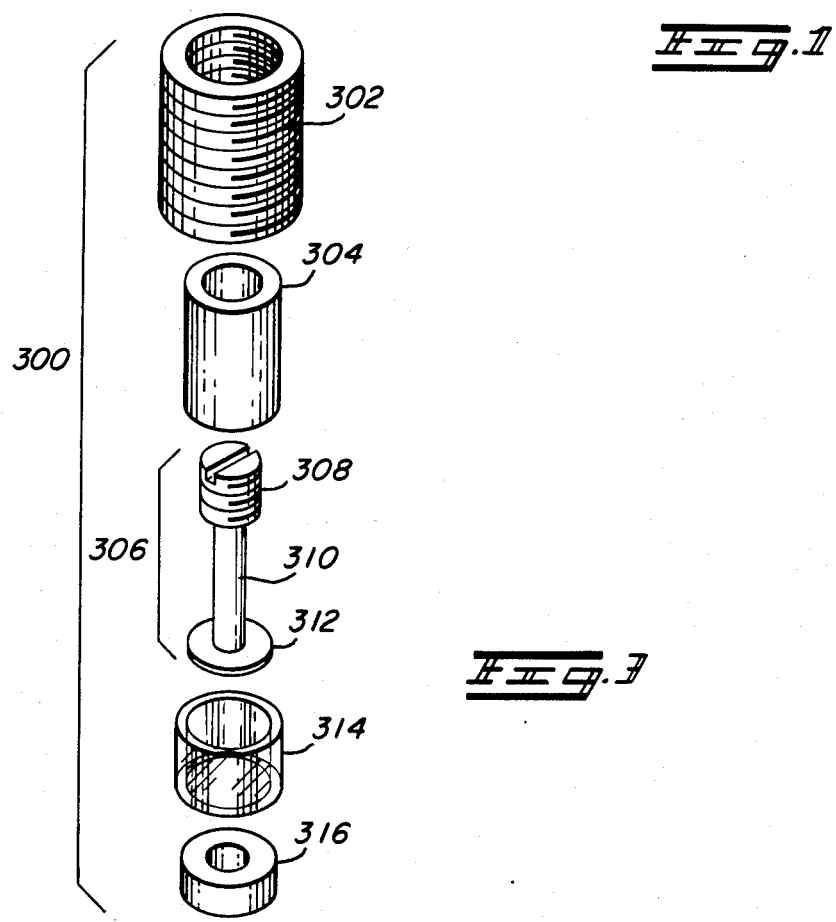
FIG. 1
FIG. 3

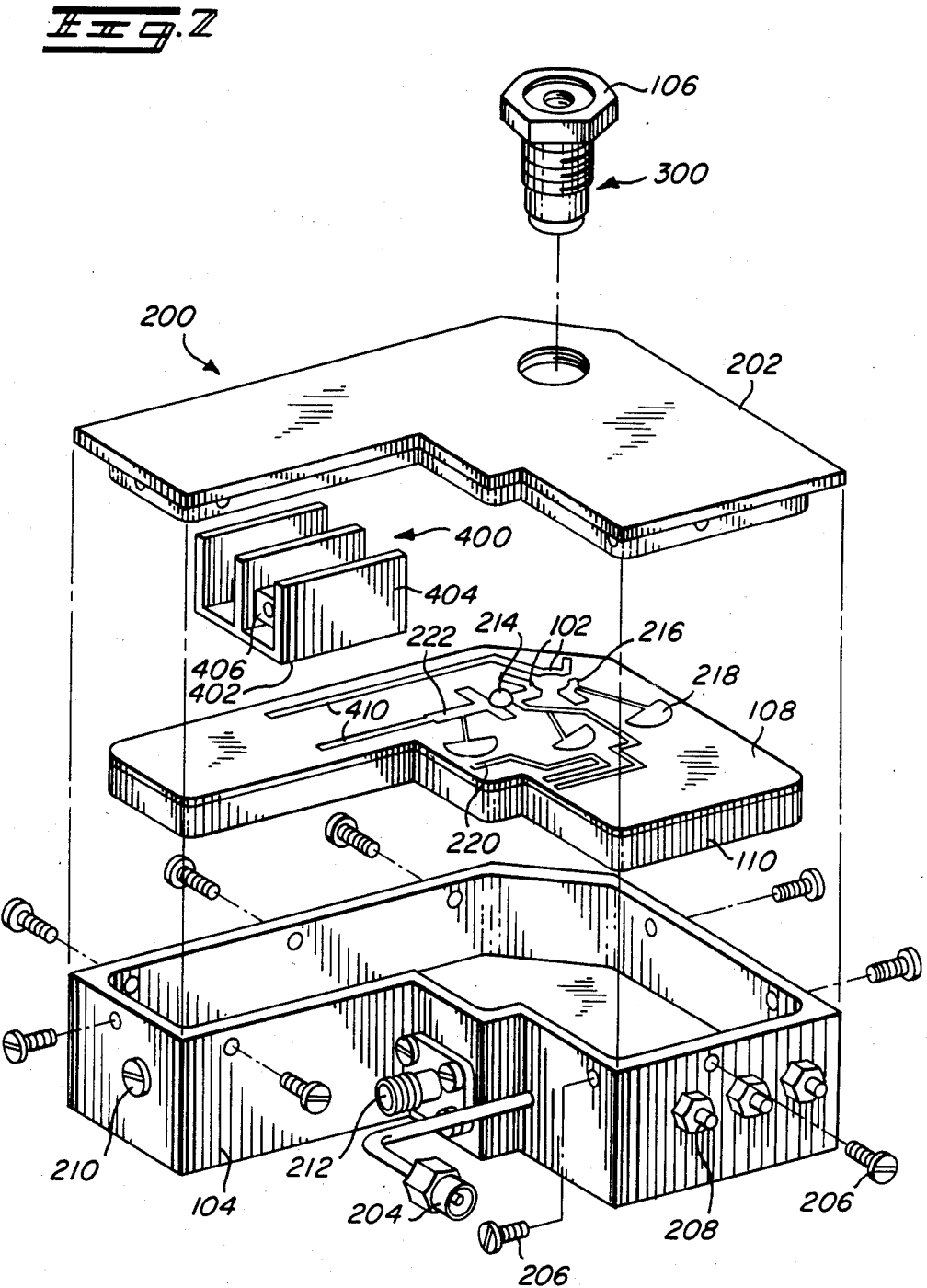

WIDE BAND DIELECTRIC RESONATOR OSCILLATOR HAVING TEMPERATURE COMPENSATION

FIELD OF THE INVENTION

This invention relates generally to the field of microwave oscillators and specifically to a wide-band microwave oscillator module which is provided with a removable temperature-compensated dielectric oscillator element.

BACKGROUND OF THE INVENTION

Microwave oscillators operate at extremely high frequencies. Accordingly, the assemblies which comprise microwave oscillators are very sensitive and must be manufactured with great precision. The resultant structures are very expensive and provide an oscillator which is very limited in tuning range. One class of microwave oscillators are referred to as dielectric resonator oscillators. The dielectric resonator is basically not tunable over a broad frequency range. The high dielectric constant of a dielectric resonator confines most of the electrical field internally, thus making it difficult to alter the resonant frequency significantly by external means. Furthermore, active circuitry associated with the dielectric resonator tends to be of a microstrip planar type and the oscillator frequency is dependent on the dielectric resonator spacial position with respect to the remainder of the oscillator circuitry.

Commercially available dielectric resonator oscillators have generally been limited to tuning range of a few percent. In addition, conventional wide-band microwave oscillators may exhibit frequency shifts when the oscillator module is exposed to a wide range of temperatures.

SUMMARY OF THE INVENTION

In summary, the present invention contemplates a microwave dielectric oscillator module which is provided with a removable temperature compensated dielectric resonator channel element. The removable temperature compensated dielectric resonator channel element cooperates with an electrically shielded housing. A substrate is mounted within the housing. Microstrip or stripline conductive patterns deposited on the substrate couple energy from the removable dielectric resonator to the remainder of the oscillator to be adjusted with a high degree of accuracy.

Accordingly, it is an object of the present invention to provide a microwave dielectric oscillator which is operative over a wide band of frequencies.

It is another object of the present invention to provide a microwave oscillator module which is compensated for the effects of temperature caused frequency shift.

It is still another object of the present invention to provide a microwave oscillator module which utilizes a removable dielectric oscillator element.

It is yet another object of the present invention to provide a microwave oscillator module which utilizes a wideband planar feedback oscillator design utilizing an adjustable phase shifter.

SUMMARY OF THE DRAWINGS

FIG. 1 is a cross-sectional view of the dielectric resonator and channel element of the present invention.

FIG. 2 is an exploded view of the modular microwave oscillator showing the relative positioning of oscillator components which are disposed in accordance with the teachings of the present invention.

FIG. 3 is an exploded view of the temperature compensated dielectric resonator channel element of the present invention.

DETAILED DESCRIPTION OF THE DRAWINGS

Figure 4:
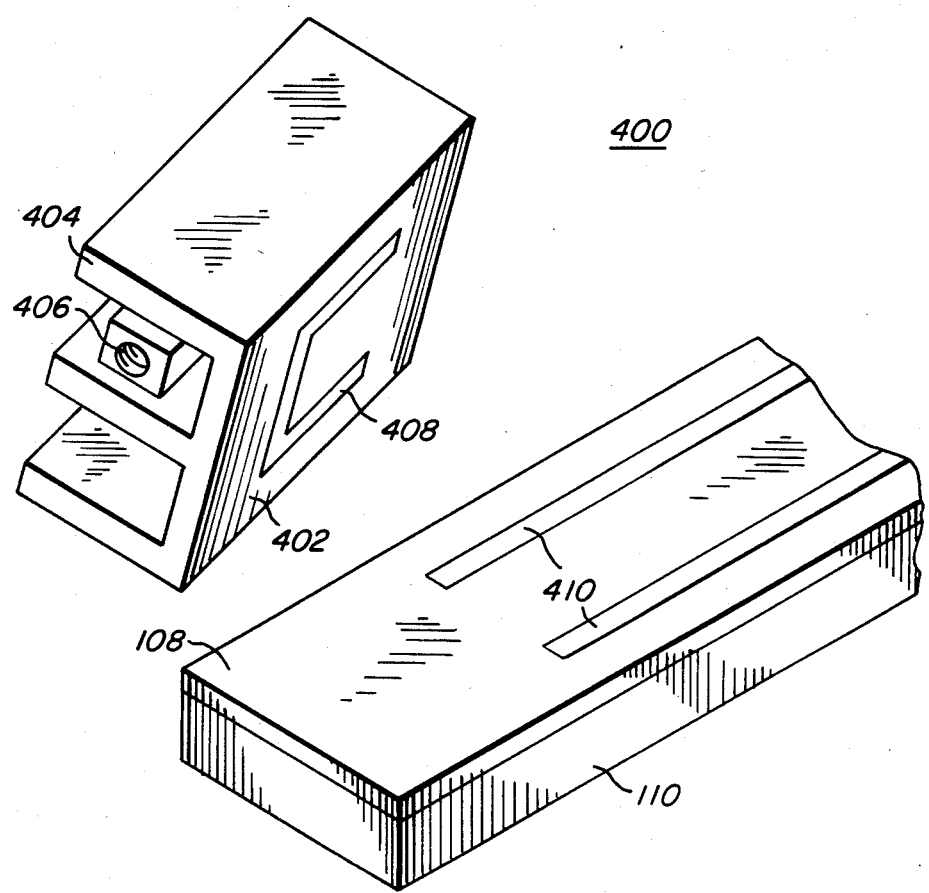
FIG. 4 is a view in perspective of the microstrip phase shifter of the present invention.

Referring now to FIG. 1, there is a cross-sectional view of the dielectric resonator module wherein the relative spacial position of the oscillator components of the present invention are shown in detail. The frequency adjustment portion of the microwave oscillator is formed by a removably assembly 300, hereinafter referred to as the channel element. The channel element 300 cooperates with a metallic housing 104 and is locked into the housing 104 with a blocking nut 106. Conventional dielectric resonators can only tune over approximately a 5% bandwidth before its Q, temperature stability, and spurious mode separation become degraded enough to seriously affect oscillator performance. In the past, unique oscillator modules of different sizes had to be used to cover alternate frequency ranges.

Referring now to FIG. 2, there is an exploded view of the modular microwave oscillator showing the relative positioning of a channel element, a GaAs FET, and a microstrip phase shifter which are disposed in accordance with the teachings of the present invention. According to FIG. 2, the threaded channel element 300 can be easily inserted or removed from the cover 202 of oscillator housing 200. The channel element 300 is retained within cover 202 over coupling lines 102 and 216 and is fastened by means of a locking nut 106. Cover 202 is retained in housing 104 by means of screws 206. A non conductive substrate layer 108 is deposited on a carrier plate 110 which is disposed within housing 104. Printed circuitry on the substrate 108 includes coupling lines 102 which couple a portion of GaAs FET 214 output power to resonator 316 and couple energy from the resonator through phase shifter 400 back into the GaAs FET 214 input. Coupling line 216 couples energy from a varactor (not shown) to the resonator 316 of FIG. 3, effecting a frequency tuning circuit. "Half moon" biasing elements 218 are used to decouple the DC and RF oscillator circuitry. GaAs FET 214 is provided with an input matching circuit 222 to match the FET active device to the impedance level of the phase shifter 400. The majority of the GaAs FET output power is coupled to communication devices through connector 204. A small portion of the output power of FET 214 is coupled by means of coupler 220 through connector 212. DC power into the oscillator is passed through RF feed-thru 208.

The dielectric oscillator will oscillate when the open loop gain of the oscillator circuit is equal to (or greater than) one and the open loop phase is equal to an integer multiple of 360 degrees. This phase criterion is an inherent tuning range limitation of a dielectric oscillator using a microwave transistor. The typical GaAs FET through phase varies by 100 degrees over the 6.4 to 7.2 GHz frequency range. In order to have a feedback oscillator cover this frequency range, the feedback phase must be adjusted. According to the teachings of the present invention, the phase shifter 400 provides this phase shifting operation. FIG. 2 shows the relative position of phase shifter 400 with respect to substrate 108.

Referring now to FIG. 3, the removable channel element 300 is formed by a threaded sleeve 302 which forms the outer casing of the channel element as well as providing the means by which the channel element 300 movably cooperates with the oscillator housing 104 of FIG. 1. An inner sleeve 304 is disposed within threaded sleeve 302 for reasons which will be more fully set forth below. The inner sleeve 304 is provided with threads on the inner surface of the sleeve 304 which cooperate with tuning rotor 306. Slug 308 provides the means by which the dielectric element 316 may be shifted within the channel element. Channel element 300 is tuned by a tuning rotor 306 which is formed by a tuning slug 308 which is coupled to a plunger element formed by elements 310 and 312. The planar surface of the metallic disk-like element 312 moves within a cylindrical element of quartz 314 which is attached to the the resonant element 316. The resonant element 316 is formed by a commercially available dielectric resonator. According to the teachings of the present invention, the tunable frequency band of the oscillator 200 is primarily affected by the thickness of the dielectric resonator 316. In the 6–7 GHz frequency range, a thickness change of approximately 0.015 inches will change the resonant frequency of the dielectric resonator approximately 300 MHz in a resonant element having approximately a 0.335 inch diameter and having a relative dielectric constant $E_r = 37$.

The teachings of the present invention provide for a dielectric oscillator with improved temperature characteristics. Commercially available dielectric resonator elements exhibit an inherent temperature stability of essentially $0 + 1$ ppm/°C. This temperature stability will be lost if the tuning structure adds any significant temperature coefficient of its own. The tuning structure of the present invention adds a negligible temperature coefficient to the oscillator of the present invention.

FIGS. 1 and 3 show the structure of the improved temperature compensated channel element 300 of the present invention. According to the principles of the present invention, as a metal is brought in closer proximity to a dielectric resonator, the resonant frequency of the dielectric oscillator becomes higher because the metal tends to confine the evanescent electromagnetic fields more tightly around the resonant dielectric element. This frequency change varies exponentially with metal-to-resonator spacing.

Most materials expand approximately linearly with temperature. The frequency change in a dielectric oscillator is exponentially related to the metal-to-resonator spacing. Therefore, the teachings of the present invention provide that the best way for a tuning structure to have negligible temperature coefficient is to insure that the metal-to-resonator spacings are substantially invariant with temperature. According to this feature of the present invention, an improved multi-element structure incorporates materials with counteracting temperature characteristics to provide improved wide-band operation over temperature. Two metal-to-resonator spacings are of concern in the context of the present invention, the resonator 316 to ground plane 112 spacing and the resonator 316 to tuning plate 312 spacing. In the preferred embodiment of the present invention, the resonator to ground plane 112 spacing is held constant over temperature by means of the steel housing 104 ($T_e = +13$ ppm/°C.), a brass carrier plate 110 ($T_e = 18$ ppm/°C.), and Zamak outer bushing 302 ($T_e = +27$ ppm/°C.), a quartz tube 314 ($T_e = 0.6$ ppm/°C.), and a dielectric resonator 316 ($T_e = +7$ ppm/°C.). As temperature increases, the metal housing 104 expansion tends to increase the resonator-to-ground plane spacing.

According to the principles of the present invention, this effect may be counteracted by the counter expansion of the brass or steel housing and a Zamak outer sleeve element. The Zamak sleeve 302 position with respect to the steel housing 104 is fixed by the locking nut 106. Although the brass and Zamak lengths may be less than that of the steel, the respectively higher expansion coefficients of these elements cause the resonator to ground plane spacing to be relatively invariant over temperature if the material lengths are chosen properly.

In the preferred embodiment, the resonator 316 to tuning plate spacing is held constant over temperature by means of a threaded Zamak outer sleeve 302, an inner invar bushing 304 ($T_c = +1.6$ ppm/°C.), a quartz cylinder 314, and a rotary tuner 306 which is movably engaged within the inner sleeve 304. The rotary tuner 306 consists of an alumina rod 310 ($T_e = +6.7$ ppm/oc), beryllium-copper threaded slug ($T_e = +17$ ppm/°C.), the combination of which are commercially available as Johannson tuners, and a copper tuning plate 312. As temperature increases, the length of the alumina rod 310 expands, tending to increase the resonant frequency of dielectric resonator 316. However, the inner invar bushing is recessed within the Zamak outer bushing as shown in FIG. 1, the Zamak expansion with temperature tends to pull the tuning plate away from the resonator 316. These two effects leads to a resonator tuning plate separation which is relatively invariant with temperature provided the distance "d" is chosen correctly given the length of the rotary tuner 306, its expansion coefficient, and the expansion coefficient of the Zamak outer sleeve 302. The microwave oscillator tuning is accomplished via tuner 306 through the cylindrical quartz tube 314. This high Q tube allows mounting of the resonator within very temperature stable structure separated from metallic disc 312 and still allow for a large tuning range.

An additional feature of this compensated tuning structure is that the overall temperature coefficient of the structure may be varied if the need arises. In the oscillator application of the preferred embodiment, the through-phase change of the active oscillator element with temperature in effect causes the oscillator frequency to change about $-2$ ppm/°c. If the resonator 316 to ground plane spacing X is maintained at approximately 0.100 inches, the frequency will shift a 0.3 ppm/micro-inch of dimension X change. Therefore, if the Zamak brass-steel lengths are judiciously chosen, as the distance X is decreased by 7 ppm/°C., the overall oscillator will be temperature compensated.

FIG. 4 is a view in perspective of the phase shifting overlay of the present invention. In the preferred embodiment, the substrate 108 is 0.015" thick Duriod having underlay lines 410 with characteristic impedance of 50Ω (0.044 inches wide), and overlay lines 408 0.044" inches wide on overlay substrate 402 made of 0.031" thick Duriod. The trombone shaped overlay line 408 allows the feedback signal to pass through and have the through phase adjusted. The low dielectric constant of the substrate allows the overall phase shifter to be close to 50Ω and for the overlapped line 410 to be close to 50Ω. The other major requirements of the phase shifter are that sufficient uniform pressure is applied to the entire structure 400 so that the overlap between 408 and 410 is maintained at approximately 0.050" for sufficient margin for electrical signal pick-up. In the preferred embodiment, 0.10" of movement of the phase shifter moves the through phase at 6.4 Ghz by approximately 60°.

In summary, a microwave dielectric oscillator module which is provided with a removable temperature compensated dielectric resonator channel element is described. The removable temperature compensated dielectric resonator channel element cooperates with an electrically shielded housing. A substrate is mounted within the housing. Microstrip or stripline conductive patterns deposited on the substrate couple energy from the removable dielectric resonator to the remainder of the oscillator circuitry. A phase adjusting element allows the output signal of the oscillator to be adjusted with a high degree of accuracy. Accordingly, other uses and modifications will be obvious to one of ordinary skill in the art without departing from the spirit and scope of the present invention.

We claim:

1. An improved wide-band microwave dielectric oscillator with a removable channel element having a dielectric resonator which determines the frequency of operation and with a substrate for supporting active oscillator circuitry, comprising:
   (a) a housing for electrically shielding and containing the microwave dielectric oscillator;
   (b) a substrate having a conductive pattern deposited thereon which couples the dielectric resonator to the active oscillator circuitry; and
   (c) a removable dielectric resonator channel element said channel element mounted in said housing in a manner which places said dielectric resonator in a proximity which provides coupling via electromagnetic field with the conductive pattern on said substrate.

2. The improved wide-band microwave dielectric oscillator of claim 1 further including a slidable phase-shifter which cooperates with said conductive pattern on said substrate.

3. An improved wide-band microwave dielectric oscillator with a removable channel element having a dielectric resonator which determines the frequency of operation and with a substrate for supporting active oscillator circuitry, comprising:
   (a) a housing for electrically shielding and containing the microwave dielectric oscillator;
   (b) a substrate having a conductive pattern deposited thereon which couples the dielectric resonator to the active oscillator circuitry; and
   (c) a temperature compensated removable dielectric resonator channel element, said channel element mounted in said housing in a manner which places said dielectric resonator in a proximity which provides coupling via electromagnetic field with the conductive pattern on said substrate.

4. The improved wide-band microwave dielectric oscillator of claim 3 further including a slidable phase-shifter which cooperates with said conductive pattern on said substrate.

5. The removable temperature compensated channel element of claim 3 comprising:
   (a) An outer sleeve having a predetermined linear expansion coefficient forming the housing of the channel element wherein the linear expansion of said channel element counteracts the expansion of the oscillator housing.
   (b) an inner sleeve having threads disposed on the inner surface of the sleeve, said inner sleeve having an essentially zero temperature coefficient wherein the inner sleeve is fixably attached to said outer sleeve;
   (c) a quartz sleeve having one end permanently attached to an end of said outer sleeve.
   (d) a dielectric resonator attached to the other end of said quartz sleeve; and
   (e) tuning rotor means having a threaded slug portion, a shaft portion, and a metallic disk-like portion, wherein said threaded slug portion movably cooperates with said inner sleeve and causes relative movement between said disk-like portion and said dielectric resonator element.

* * * * *